(12) United States Patent
Perotto et al.

(10) Patent No.: US 8,905,784 B2
(45) Date of Patent: Dec. 9, 2014

(54) DEVICE FOR PRODUCING A SEALED ELECTRICAL CONNECTION THROUGH A WALL

(75) Inventors: Stéphane Perotto, Ayse (FR); Florian Saulnier, Marnaz (FR)

(73) Assignee: Bontaz Centre R & D, Marnaz (FR)

( * ) Notice: Subject to any disclaimer, the term of this patent is extended or adjusted under 35 U.S.C. 154(b) by 78 days.

(21) Appl. No.: 13/583,202

(22) PCT Filed: Mar. 9, 2011

(86) PCT No.: PCT/EP2011/053548
§ 371 (c)(1),
(2), (4) Date: Dec. 18, 2012

(87) PCT Pub. No.: WO2011/110599
PCT Pub. Date: Sep. 15, 2011

(65) Prior Publication Data
US 2013/0203284 A1    Aug. 8, 2013

(30) Foreign Application Priority Data
Mar. 9, 2010   (FR) ...................... 10 51682

(51) Int. Cl.
| | | |
|---|---|---|
| H01R 13/58 | (2006.01) | |
| H05K 5/06 | (2006.01) | |
| B29C 45/14 | (2006.01) | |
| H01R 13/52 | (2006.01) | |
| H01R 43/24 | (2006.01) | |
| H01R 13/74 | (2006.01) | |
| H01R 13/533 | (2006.01) | |
| H01R 13/405 | (2006.01) | |

(52) U.S. Cl.
CPC ........ H01R 13/5202 (2013.01); H01R 13/5845 (2013.01); H05K 5/069 (2013.01); B29C 45/14639 (2013.01); H01R 43/24 (2013.01); H01R 13/74 (2013.01); H01R 2201/26 (2013.01); H01R 13/533 (2013.01); H01R 13/405 (2013.01); H01R 13/521 (2013.01)
USPC .......................................... 439/606; 439/587

(58) Field of Classification Search
CPC ........... H01R 13/5202; H01R 13/5205; H01R 13/5208; H01R 13/5219; H01R 43/24
USPC .................. 439/604, 606, 271, 275, 587, 589
See application file for complete search history.

(56) References Cited

U.S. PATENT DOCUMENTS 4,679,875 A * 7/1987 Ramsey ........................ 439/604
5,567,170 A * 10/1996 Kroeber ........................ 439/186

(Continued)

FOREIGN PATENT DOCUMENTS

EP    0696827 A2    2/1996
FR    2906411 A1    3/2008

(Continued)

OTHER PUBLICATIONS

International Search Report dated Jun. 1, 2011 for PCT/EP2011/053548.
Office Action issued in corresponding Japanese Patent Application No. 2012-556508 dated Oct. 7, 2014.

Primary Examiner — Thanh Tam Le
(74) Attorney, Agent, or Firm — Pearne & Gordon LLP (57) ABSTRACT

The invention relates to a device for producing a sealed electrical connection through an engine block crankcase wall in order to connect a sensor or actuating unit contained in the engine block to a central unit comprising a connector provided with at least one bore, which is intended to be arranged in an opening of said wall, at least one electrical contact connected to a wiring harness, said electric contact being surrounded by at least one O-ring seal and arranged in the bore of the connector, said device also comprising an over-moulded part on the wiring harness, an end of the electrical contact connected to the wiring harness and an end of the connector, such that, after the device has been mounted in the opening, the junction between said over-moulded part and the connector is situated on one side of the wall.

21 Claims, 6 Drawing Sheets

(56) References Cited

U.S. PATENT DOCUMENTS

| | | | |
|---|---|---|---|
| 6,716,071 B2 * | 4/2004 | Miyazaki | 439/859 |
| 7,077,676 B2 * | 7/2006 | Matsumoto et al. | 439/271 |
| 7,530,843 B1 | 5/2009 | Tesfay et al. | |
| 8,317,531 B2 * | 11/2012 | Kleinke | 439/275 |
| 8,449,328 B2 * | 5/2013 | Ooki | 439/606 |
| 2009/0186506 A1 | 7/2009 | Chen et al. | |

FOREIGN PATENT DOCUMENTS

| | | |
|---|---|---|
| GB | 2420919 A | 7/2006 |
| JP | 2009-070656 A | 4/2009 |
| JP | 2009-272053 A | 11/2009 |

* cited by examiner

DEVICE FOR PRODUCING A SEALED ELECTRICAL CONNECTION THROUGH A WALL

TECHNICAL FIELD AND PRIOR ART

The present invention relates to a device for producing a sealed electrical connection through a wall, for example to connect a sensor or an active device, for example arranged in an engine block with a control unit external to the engine block.

In the automobile field, numerous sensors and numerous actuating units are used, these are connected to a central unit arranged in an automobile vehicle. The sensors are for example liquid, temperature or pressure level sensors, and the actuating units are for example electromagnetic valves or actuators.

Sensors and/or actuating units may be arranged for example in the engine, more particularly in the engine block, whereas the central unit is arranged anywhere in the vehicle. Wired connections in the form of electrical harnesses are then provided to connect the sensors and actuating units to the central unit. In the case of sensors and actuating units arranged in the engine block, the electrical harnesses pass through the crankcase, said crossing having to be leak-tight.

Generally, the sensor or actuating unit comprises a portion of wiring harness provided at an end of an electrical contact intended to be connected to an electrical contact of a wiring harness connected to the central unit. The wiring harness of the sensor or actuating unit passes through the wall of the crankcase of the engine block and the electrical contact protrudes outside of the engine block where it is connected to the contact of the wiring harness of the central unit.

A device assuring the sealed crossing of the crankcase wall of the engine block comprises a connector, known as crankcase passage connector, made of plastic material mounted in a sealed manner in a passage leading through the wall by means of gaskets arranged between its outer periphery and the edge of the passage in the crankcase wall. This embodiment offers a satisfactory sealing.

On the other hand, problems of sealing arise between the crankcase passage connector, the wiring harness and the electrical contact of the sensor or actuating unit.

Several solutions exist to achieve such a sealing.

One of these consists in forming the electrical contact from a metal sheet cut and folded and to form the crankcase passage connector by over-moulding directly on the electrical contact. However, the sealing between the strands of cables of the wiring harness and the over-moulded part is delicate to obtain. Problems of sealing can arise on account of the rise of the oil located in the engine block by capillarity along the strands or between the strands of the cables of the harness.

Another solution consists in forming the electrical contact by machining and fitting thereto an O-ring seal. The crankcase passage connector is then over-moulded directly on the contact and the O-ring seal. Said solution has several drawbacks:

Unlike a conventional assembly in which the gasket is mounted in a bore, the bore is formed around the gasket by over-moulding, it is then difficult to anticipate the behaviour of the gasket. Since the sealing is formed by over-moulding, it thus depends directly on the injection parameters which consequently need to be controlled with a high precision.

The gasket may be deteriorated during the over-moulding by the temperature of the plastic material, the injection rate and/or the pressure of the plastic material. In the event of damage to the gasket, this is not visually detectable.

The axial position of the electrical contact in the crankcase passage connector is not controlled since, during the injection, the contact can move in the injection mould. To overcome this drawback, it may be provided to maintain the contact by a pin of the mould, however the contact becomes visible through the connector at pin passages. Risks of short-circuits can then arise in the presence of a conductive liquid.

Finally, the precision required for positioning the contact in the mould extends the over-moulding time and consequently increases the manufacturing cost of the crankcase passage connector.

The document GB 2 420 919 describes a device for connecting cables to a submersible pump. Said connection device comprises a large number of parts, which implies problems of reliability since the risks of assembly defects and the number of potential leakage routes are increased and there is a high production cost. It is thus not suited to an application in the automobile field in which it is sought to simplify the devices and to reduce their cost.

DESCRIPTION OF THE INVENTION

It is consequently an aim of the present invention to offer an electrical connection device enabling a crossing of a wall, the sealing of which is improved compared to those of the prior art, in particular enabling the leak-tight crossing of an engine block crankcase wall, and offering a simple conception and a reduced number of parts.

The aforementioned aim is attained by an electrical connection device through a wall comprising a crankcase passage connector formed beforehand, provided with an outer surface intended to cooperate with a surface of an opening formed in the wall, and at least two traversing bores, at least two electrical contacts, each at the end of a wiring harness intended to be connected to a sensor or an actuating unit, the electrical contacts each being mounted in a bore, sealing means being interposed between the contacts and the inner surface of the bores, and means of mechanically maintaining the electrical harnesses with respect to the crankcase passage connector. Said mechanical maintaining means are produced in the form of an over-moulded part surrounding a portion of the contacts protruding from the bore and a portion of electrical harnesses and integral with the connector. Thus no over-moulding is involved in the sealing through the wall, the over-moulded part being situated outside of the opening in the wall. The sealing means between the electrical contacts and the crankcase passage bore being for example formed by at least one gasket fulfilling its conventional function, the sealing is well controlled.

The over-moulded part also assures an electrical insulation between the two telemetric contacts. Moreover, it mechanically maintains the electrical contacts avoiding their backward movement. Furthermore, the over-moulded part immobilises the wires with respect to the terminals of the electrical contacts, avoiding a breakage of the electrical connection, for example due to the breakage of the wires through fatigue, for example due to vibrations or incorrect handling.

Thus the invention, in a very simple manner with a reduced number of parts, proposes a robust connection device, of extended lifetime, of relatively simple manufacture and of reduced cost price. Said connection device is then particularly suited to the automobile field.

Furthermore, the fitting of the contact in the bore of the crankcase passage connector may be obtained by the compression of the gaskets in the bore, by forcing, by clipping and/or bonding. Thus the position of contact is controlled, and in the case of an over-moulded part, its formation does not risk modifying the position of the electrical contact. Furthermore, the fitting is simplified and rapid.

In an application to an engine block, the over-moulded part is arranged entirely inside the engine block, the junction between said over-moulded part and the crankcase passage connector is thus arranged in the engine block upstream of the sealing between the engine block and the crankcase passage connector in the sense of potential leaks. Consequently, the over-moulded part no longer has a sealing function, but only a function of mechanically maintaining the contact(s) and the harness(es) and the electrical insulation between the electrical contacts. A slight variation in the injection parameters for carrying out the over-moulding then has no impact on said functions. Even if the junction between the over-moulded part and the crankcase passage connector is not leak tight, this is not bothersome, since the leaks are stopped by the gaskets arranged between the crankcase passage connector and the opening in the crankcase wall of the engine block and between the electrical conductor and the crankcase passage connector.

Furthermore, thanks to the invention, conventional gaskets, the efficiency of which is proven, may be used for all of the sealings.

The subject matter of the present invention is then principally a sealed electrical connection device through a wall comprising a connector provided with at least two bores, which is intended to be arranged in an opening of said wall, at least two electrical contacts each connected to a wiring harness, said electrical contacts being surrounded by sealing means and each arranged in a bore of the connector, the sealing means assuring the sealing between the electrical contacts and the bores, said device also comprising means of mechanically maintaining the electrical harnesses on the connector arranged at an end of the bore of the connector such that, when the device is put in place in the opening of the wall, the mechanical maintaining means being formed by a part over-moulded on the electrical harnesses, an end of the electrical contacts connected to the harnesses and an end of the connector, such that, when the device is put in place in the opening of the wall, the junction between said over-moulded part and the connector is situated on one side of the wall.

In an advantageous manner, the electrical contact comprises in its outer periphery at least one groove for the positioning of at least one gasket, for example an O-ring seal, forming the sealing means. The electrical contact may comprise an end portion intended to come into contact with another electrical contact and a portion of larger diameter on the side of the wiring harness, said at least one groove receiving a gasket being formed in said portion of larger diameter, the bore comprising a median portion of smaller diameter for maintaining the end portion.

The electrical contact may be maintained in the bore by the compression of said at least one gasket and/or by a force fitting of said contact in the bore and/or by bonding and/or by clipping.

The connector preferably comprises means of fastening the mechanical maintaining part. In the embodiment example where the mechanical maintaining part is an over-moulded part, said means of fastening are formed by means of attachment situated at the end on which the over-moulded part is formed. The connector comprises for example on its outer surface a span intended to assure the sealing with the surface of the opening of said wall, and means participating in the blocking in axial position of the device in the opening. The connector may also comprise at the open end of the bore means of joining an electrical contact intended to come into contact with the electrical contact of said device.

By way of example, the wiring harness is for example connected to a sensor or an actuating unit and the electrical contact is intended to be connected to a central unit. The wall, for its part, may be the crankcase wall of an engine block of an automobile vehicle engine and the sensor is a liquid, pressure or temperature level sensor and the actuating unit is an electromagnetic valve or an actuator.

The present invention also relates to a method for producing the sealed electrical connection device according to the present invention comprising the steps:

of forming the connector by injection of plastic material,
of forming the electrical contact and the wiring harness,
of putting in place sealing means around the electrical contact,
of putting in place the contact in the bore of the connector,
of assuring a mechanical maintaining of the harness, for example by clipping, by bonding or by over-moulding of the over-moulded part by injection of plastic material.

BRIEF DESCRIPTION OF DRAWINGS

The present invention will be better understood by means of the description that follows and the appended drawings in which.

DETAILED DESCRIPTION OF PARTICULAR EMBODIMENTS

Figure 1:
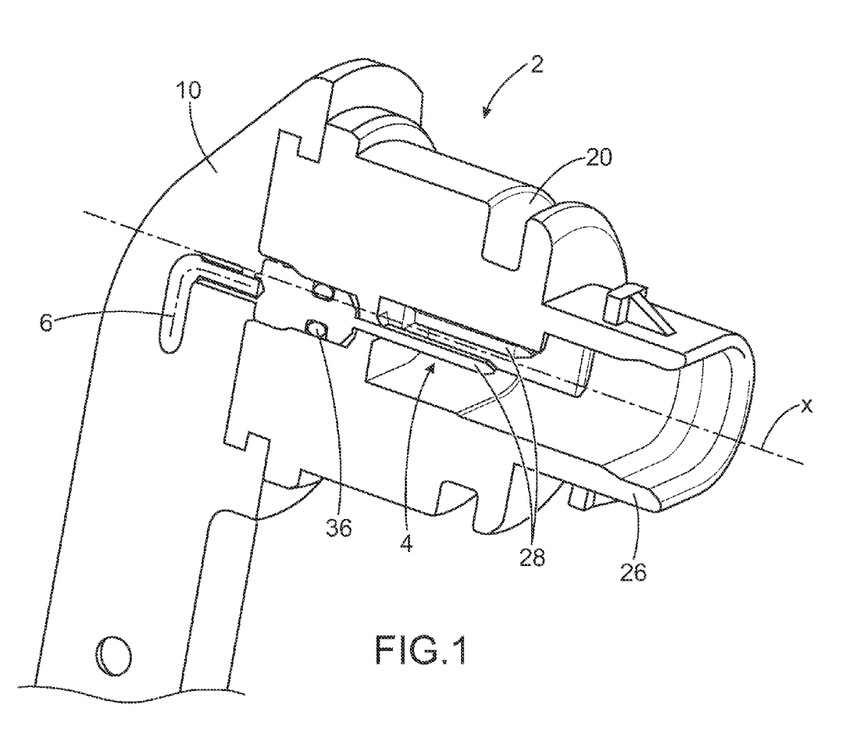
FIG. 1 is a longitudinal sectional perspective view of a connection device according to the present invention.

In FIG. 1 may be seen an embodiment example of an electrical connection device through a wall, for example a crankcase wall of an engine block of an automobile vehicle intended to connect a component situated in the engine block to a central unit arranged for example in the engine compartment at a distance from the engine.

In the description that follows, it will be considered, by way of example, that the wall is an engine block crankcase wall, but this is not in any case limiting as regards the application of the present invention.

The component to be connected is for example a measuring component, such as a sensor of liquid, pressure, temperature level . . . or an actuating unit, such as an electromagnetic valve or an actuator, such as an electromagnet. In the remainder of the description, the sensor or the actuating unit will be designated by the generic term of the component to be connected for purposes of simplicity.

The connection device according to the present invention represented in FIG. 1 comprises a first part 2 or connector, designated hereafter crankcase passage connector, at least one electrical contact 4, two in the example represented, a wiring harness 6 electrically connected to an end of each electrical contact 4, the other end of the wiring harness 6 being intended to be connected to the component to be connected 8 (represented schematically in FIG. 5B) and means of mechanically maintaining the wiring harness on the crankcase passage connector 2. In the example represented and, in an advantageous manner, said maintaining means are formed by an over-moulded part 10.

Figure 2:
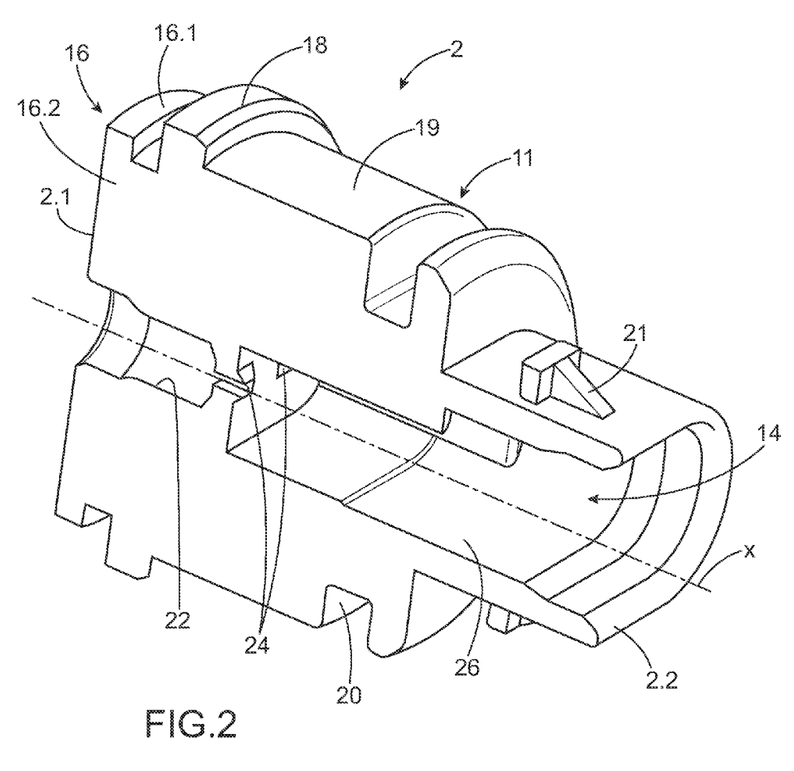
FIG. 2 is a longitudinal sectional perspective view of the crankcase passage connector implemented in the connection device of FIG. 1.

The crankcase passage connector 2, represented singly in FIG. 2, has a longitudinal axis X. The crankcase passage connector 2 comprises an outer surface 11 intended to enter into contact with the surface of an opening 12 (FIG. 5A) formed in a wall 13 and two traversing bores 14 of axis X, each intended to house an electrical contact.

When the device according to the present invention is mounted in the opening 12 of the wall to be passed through, the longitudinal ends 2.1 and 2.2 protrude on either side of the inner and outer faces of the wall 13. A first end 2.1 of the crankcase passage connector 2 protrudes into the engine block and a second end 2.2 of the crankcase passage connector 2 protrudes outside of the engine block.

The outer surface 11 of the crankcase passage connector 2 from its first longitudinal end 2.1 to its second longitudinal end 2.2 will now be described.

In the example represented, the first end 2.1 comprises advantageously means 16 enabling an improved attachment of the over-moulded part 10 on the crankcase passage connector 2. The means 16 are, in the example represented, formed by a crown 16.1 arranged at the end of a sleeve 16.2 lining a first end 12.1 of the bore 14. The crown 16.1 forms a radial protuberance that the over-moulded part surrounds, thereby improving its attachment to the crankcase passage connector.

The outer surface 11 then comprises an annular protuberance 18 intended to come to bear against the inner face of the wall 13. The annular protuberance 18 may be formed by over-moulding. The outer surface then comprises a sealing span 19 between the opening in the wall and the connector 2. The span 19 may for example cooperate with gaskets fitted in the opening or then comprise grooves for the fitting of gaskets.

The outer surface 11 also comprises following an annular groove 20 intended to be situated outside of the engine block and intended to receive a means of blocking in axial position 23 (FIG. 5A) the connection device in the opening, for example a clip or staple type blockage ring, intended to come to bear against the outer face of the wall 13. The length of the span 19 between the annular protuberance 18 and the annular groove 20 is thus substantially equal to the thickness of the wall 13. Other blocking means may be provided, it may be a pin and in this case the connector comprises a housing for the pin, or a threading cooperating directly with the opening 12 or with a nut arranged outside of the engine block and coming to bear on the wall 13.

Finally, the second end 2.2 of the crankcase passage connector 2 comprises means of joining 21 an electrical contact connected to a central unit. In the example represented, the second end is in the form of a male part provided with a conical protuberance extending radially towards the outside to assure a fastening by clipping with a female part.

The bores 14 will now be described. These mainly comprise three portions 22, 24, 26 arranged axially from a first end 2.1 on the inner side of the engine block to a second end 2.2 on the outer side of the engine block.

The first portion 22 of diameter $D_{22}$ and the third portion 26 are separated by a portion 24 of reduced section.

In the example represented, the third portions 26 of the two bores are common, the two end portions 28 of the two electrical contacts being arranged in parallel in the single portion 26.

Figure 3:
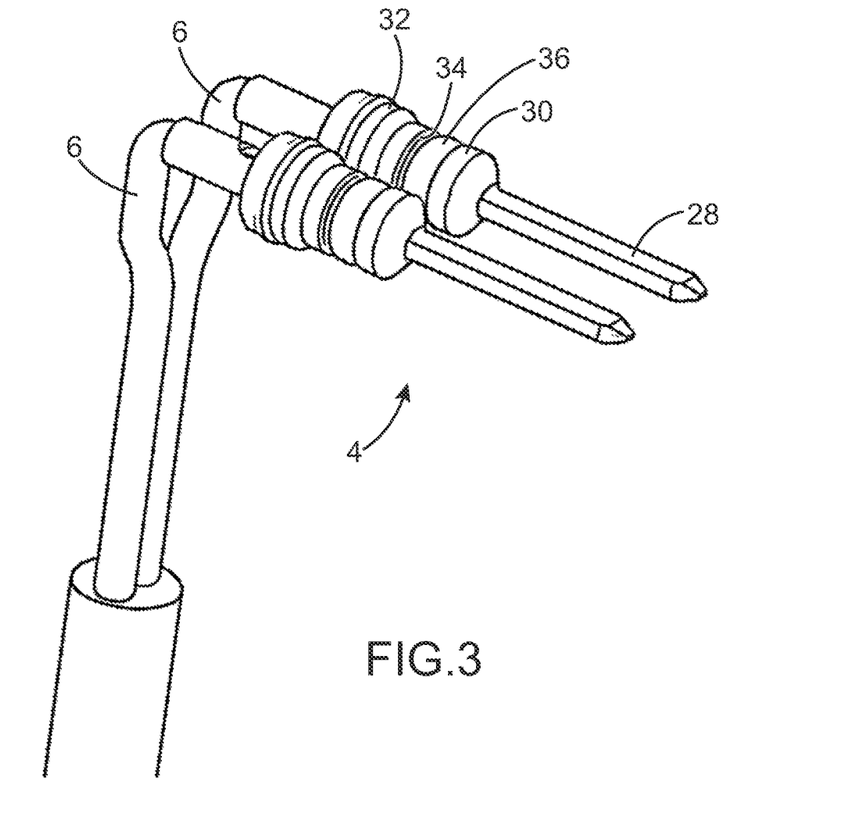
FIG. 3 is a detailed view of the electrical contacts and electrical harnesses before their fitting in the crankcase passage connector.

In FIG. 3 may be seen an embodiment example of electrical contacts 4 which can be implemented in the present invention.

In the example represented, the device implements two substantially similar electrical contacts, but only one thereof will be described in detail.

The electrical contact 4 comprises a first end portion 28 intended to come into contact with the electrical contact connected to the central unit, a median portion 30 bearing the sealing means and a portion 32 connected to the wiring harness 6. The wires of the cable of the wiring harness 6 are crimped or soldered on the electrical contact.

In the example represented, the end portion 28 advantageously comprises a rectangular section cooperating with the portion 24 having a section of corresponding substantially rectangular shape facilitating the orientation of the contact during its assembly.

The median portion 30 comprises on its outer periphery at least one groove 34, advantageously several, in which are mounted gaskets 36, for example O-ring seals.

The diameter $D_{30}$ of the median portion 30 and that of the first portion $D_{22}$ of the bore are chosen to assure the compression of the gaskets 36 and the sealing between the electrical contact and the bore.

As explained previously, the shape of the second portion 24 of the bore is such that it enables the passage of the end portion 28 of the contact.

In the example represented, the first portion 22 of the bore is joined to the second portion 24 by a truncated cone shape facilitating the positioning of the electrical contact. The median portion of the electrical conductor has a corresponding shape. The conical shape of the portion 24 also facilitates the insertion of the gasket in the bore.

The electrical contact is maintained in the crankcase passage connector 2 by compression of the gaskets, and/or by forced fitting of the end portion of the contact in the second portion 24 of the bore and/or by bonding and/or by clipping.

The third portion 26 of the bore, through the intermediary of a gasket, assures the sealing between the connection device according to the invention and the electrical contact connected to the control unit, said gasket assures a sealing vis-á-vis the external environment of the engine block. Any other means could be envisaged, a gasket could be fitted on the female part of the electrical contact connected to the central unit.

The over-moulded part 10 is formed on the attachment portion of the crankcase passage connector and around the portion 32 of the electrical contact and the wiring harness 6. The over-moulded part 10 completely covers the conductive parts 32 of the electrical contacts avoiding a risk of short-circuit. Furthermore, it assures a maintaining in a given position of the electrical harnesses and enables an easy handling of the connection device for its positioning in the opening of the wall. The over-moulded part 10 may either be made of rigid material or of material having a certain flexibility as a function of the application and the necessity to orient the electrical harness(es).

In a variant, the mechanical maintaining of the wiring harness may be achieved by clipping or by bonding, additional parts then being able to be provided between the harness and the connector.

The crankcase passage connector and the over-moulded part may be made of thermoplastic or elastomeric material.

An example will now be described of a method of manufacturing the electrical connection device according to the present invention comprising a single electrical contact.

Firstly a crankcase passage connector is formed by injection of plastic material, as well as an electrical contact connected to a wiring harness. The electrical contact is for example formed by machining. One or more grooves are machined on the outer periphery of the median portion of the electrical contact.

During a following step, an O-ring seal is put in place in each groove of the electrical contact. The electrical contact is then introduced into the bore of the crankcase passage connector, until it comes to bear against the portion 24 or against any support of the connector 2. In the example represented, by virtue of its rectangular section, the portion 24 serves to orient the electrical contact in the connector, the portion 28 of which also has a rectangular section.

Figure 4:
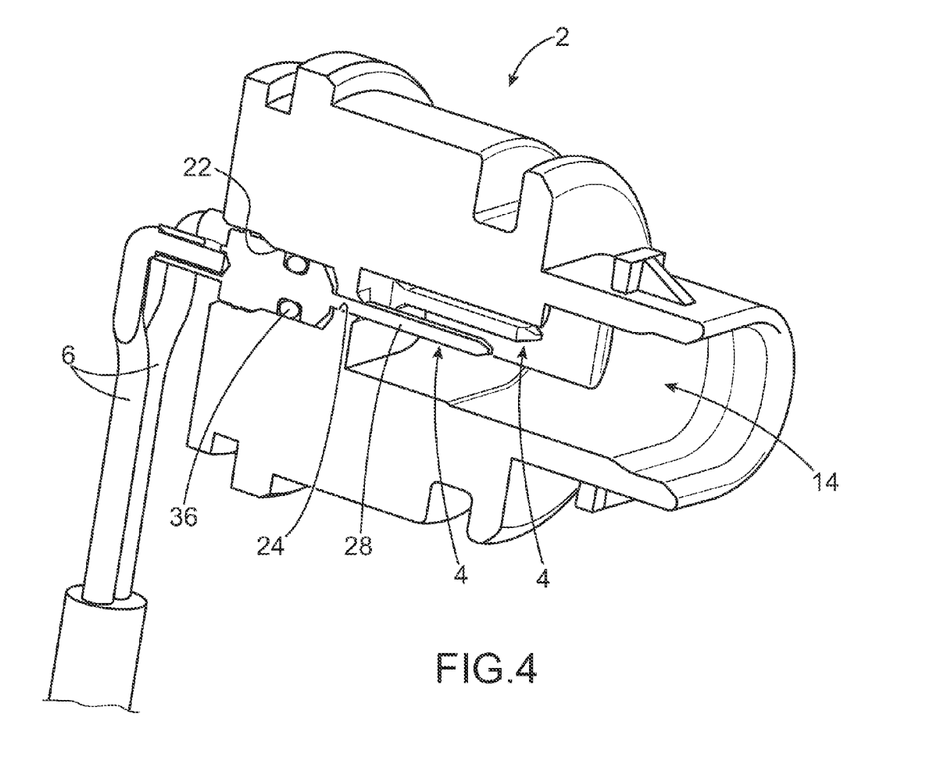
FIG. 4 is a longitudinal sectional perspective view of the connection device according to the invention before carrying out the over-moulding.

The gaskets are compressed and assure the sealing and optionally the maintaining of the contact. The end portion 32 of the electrical contact protrudes into the third portion of the bore according to a given dimension. The assembly thereby formed may be seen in FIG. 4.

A bonding step may also be provided. In the case where the maintaining is obtained by clipping, the clipping takes place simultaneously with the fitting of the electrical contact in the bore.

The crankcase passage connector/electrical contact and wiring harness assembly thereby formed is arranged in a mould, the wiring harness being arranged along the desired orientation. The over-moulded part 10 is then formed by injection of plastic material into the mould. Said injection does not cause the displacement of the electrical contact, since it is maintained moreover firmly in the crankcase passage connector 2.

The connection device according to the present invention ready to be mounted in a wall opening and to be connected to a component arranged in the engine block and to a central unit is then obtained.

Figure 5A:
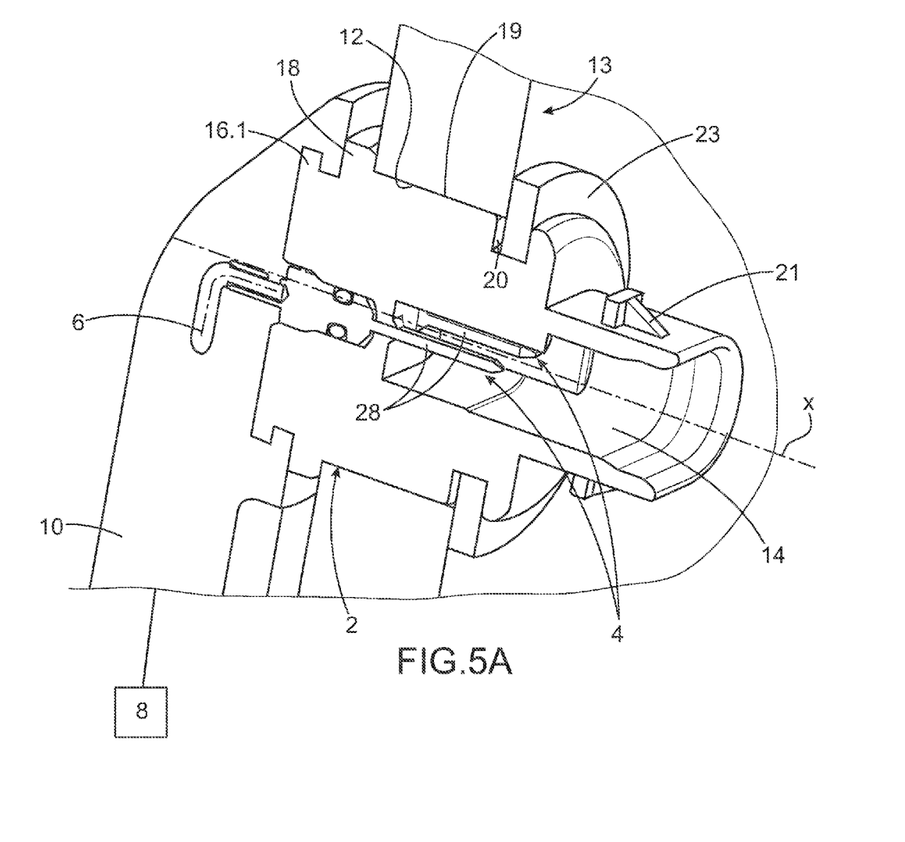
FIGS. 5A and 5B are longitudinal sectional views of the device according to the present invention in place in an opening of a wall and of said device connected to an electrical contact connected to a central unit respectively.
Figure 5B:
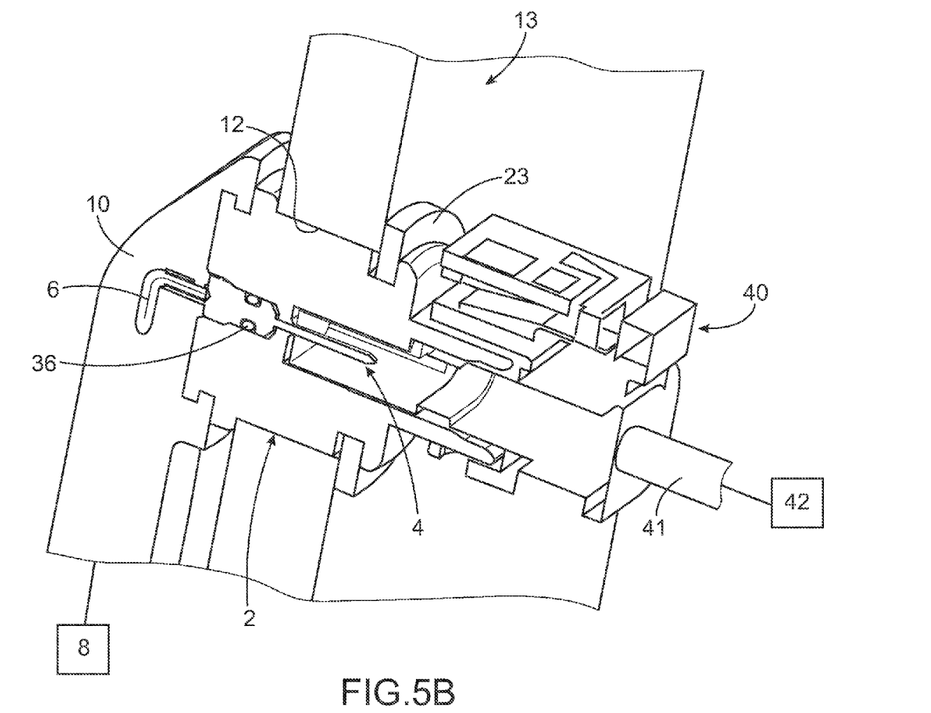

The fitting of such a device in the wall may be seen in FIGS. 5A and 5B and takes place in the following manner:

The crankcase passage connector 2 is introduced into the opening 12 of the wall 13 such that its annular protuberance 18 comes to bear against the inner face of the wall, and a blocking means 23 is mounted in the groove 20, assuring the axial maintaining of the device in the wall. Said blocking means 23 may be, in the example represented, a clip or a staple. In an embodiment variant, it could be a pin or a threading. Gaskets may be mounted on the span of the crankcase passage connector or in the opening depending on the option chosen.

The wiring harness 6 situated in the engine block is connected to the component to be connected 8. Other electrical contacts 40 connected to the central unit 42 via another wiring harness 41 are then connected to the device according to the invention, the assembly being carried out in the example represented by clipping.

Thanks to the invention, the sealing between the connection device and the wall is assured by one or more gaskets and between the electrical contact(s) and the crankcase passage connector by one or more gaskets. The gaskets may be O-ring seals employed in their normal role, thus assuring a very good sealing.

O-ring seals moreover have the advantage of offering very good robustness to thermal shocks, particularly during cold start-ups, which makes it possible to assure a sealing in all operating configurations, and does so even in the case where the wire sheath of the wiring harness is pierced for example during the formation of the over-moulded part or during the use of the engine block.

Furthermore, the rise by capillarity of the oil for example along the wires of the wiring harness is no longer problematic since the O-ring seals are situated after the wiring harness in the sense of potential leaks.

Since it is not the over-moulded part that assures the sealing, the injection pressure may be reduced. Moreover, since the over-moulding of the wires of the electrical harnesses is generally problematic, thanks to the invention the necessity of obtaining an over-moulding of very good quality at this spot is avoided.

The connection device according to the present invention also has the advantage of being simple to carry out. In fact, since the management of the over-moulding step is no longer critical since it is no longer the over-moulded part that assures the sealing, this step may be carried out with a lesser precision.

Moreover, there is no risk of modification of the position of the electrical contacts. There is thus no need to use pins to maintain the contacts in the mould, these are thus not visible when the over-moulding is terminated. And the positioning of the crankcase passage connector/electrical contact and wiring harness assembly in the mould is simplified.

The correct positioning of the electrical contact in the bore makes it possible to easily respect an overshoot dimension determined from the end portion of the electrical contact, the tolerance of which, in certain applications may be of the order of a $1/10^{th}$.

In the embodiment example comprising an over-moulded part, the over-moulding step is simpler and quicker, the mould is also simplified since the shape of the over-moulded part is very simple. Consequently, the manufacturing cost may be reduced, especially since the formation of the crankcase passage connector may be carried out in an automatic manner.

It is obviously understood that the connection device can enable more than two electrical contacts to be connected simultaneously. Preferably, the crankcase passage connector conserves substantially a revolution geometry at least at the sealing span, which simplifies its manufacture and the realisation of the sealing with the wall, the electrical contacts are then for example spread out in a uniform manner around the revolution axis.

The electrical contacts mounted in a same crankcase passage connector may be connected in some cases to sensors and in others to actuating units. Moreover, it may be provided that several of said connection devices according to the invention are mounted through the crankcase wall of a same engine block.

The present invention applies in particular to the connection through the wall of an engine block of an automobile vehicle engine between sensors and/or actuating units and a central unit.

It is obviously understood that the electrical connection device may be implemented each time that a sealed electrical connection through a wall is required.

The invention claimed is:

1. An electrical device configured to provide a sealed connection through a wall comprising:
   a connector comprising a bore having at least two portions, wherein the connector is configured to be arranged in an opening of said wall and wherein the bore extends through the wall, wherein at least a part of the bore is arranged on one side of the wall and wherein at least another part of the bore is arranged on another side of the wall, at least two electrical contacts each having an end connected to a wiring harness, wherein at least one of said at least two electrical contacts is surrounded by a seal device, wherein said at least two electrical contacts are arranged in the bore, and wherein the seal device is configured to form a seal between the at least one of said at least two electrical contacts and the bore, a holder arranged at an end of the bore for mechanically maintaining the wiring harness on the connector such that, when the electrical device is put in place in the opening of the wall, a junction between the holder and the connector is situated on the one side of the wall, wherein a part of the holder is over-moulded on the wiring harness, on the ends of the at least two electrical contacts, and on an end of the connector.

2. The electrical device according to claim 1, wherein the at least one of said at least two electrical contacts comprises at least one groove configured to receive at least a portion of the seal device.

3. The electrical device according to claim 2, wherein the at least two electrical contacts each comprise an end portion configured to contact with another electrical contact, and wherein the at least one of said at least two electrical contacts further comprises a portion of larger diameter, wherein said at least one groove is formed in said portion of larger diameter, and wherein the bore further comprises a median portion of smaller diameter for maintaining the end portions of the at least two electrical contacts.

4. The electrical device according to claim 2, wherein the seal device comprises a gasket.

5. The electrical device according to claim 4, wherein the gasket comprises an O-ring.

6. The electrical device according to claim 1, wherein the connector comprises a fastener configured to fasten the holder to the connector for mechanically maintaining the wiring harness.

7. The electrical device according to claim 6, wherein the fastener is formed by an attachment of the part of the holder that is over-moulded.

8. The electrical device according to claim 1, wherein each of the at least two electrical contacts comprises in its outer periphery at least one groove configured to each receive at least a portion of a corresponding seal device, and wherein the at least two electrical contacts are maintained in the bore by at least one of the compression of said corresponding seal devices, a force fitting of said at least two electrical contacts in the bore, bonding, and clipping.

9. The electrical device according to claim 8, wherein each of the corresponding seal devices comprises a gasket.

10. The electrical device according to claim 9, wherein the gasket comprises an O-ring.

11. The electrical device according to claim 1, wherein the connector comprises on its outer surface a span configured to form a seal with an inner surface of the opening of said wall.

12. The electrical device according to claim 1, wherein the connector comprises means of joining other electrical contacts, wherein the other electrical contacts are configured to come into contact with the at least two electrical contacts.

13. The electrical device according to claim 1, wherein the wiring harness is connected to a sensor or an actuating unit and the at least two electrical contacts are configured to be connected to a central unit via other electrical contacts.

14. The electrical device according to claim 13, wherein the wall is a crankcase wall of an engine block of an automobile vehicle engine and the sensor is a liquid, pressure or temperature level sensor and the actuating unit is an electromagnetic valve or an actuator.

15. The electrical device according to claim 1, further comprising a blocking means coupled to the connector and arranged on the other side of the wall, wherein the blocking means is configured to contact the other side of the wall to maintain the connector in the wall.

16. The electrical device according to claim 1, wherein the at least two electrical contacts are arranged entirely within the bore.

17. The electrical device according to claim 1, comprising another seal device arranged between the connector and the opening of said wall, wherein the other seal device is configured to form a seal between the connector and the opening of said wall.

18. The electrical device according to claim 17, wherein the other seal device comprises a gasket.

19. The electrical device according to claim 18, wherein the gasket comprises an O-ring.

20. The electrical device according to claim 1, wherein the connector comprises a plastic material.

21. A method of producing the electrical device according to claim 1 comprising the steps of:
forming the connector by injection of plastic material,
forming the at least two electrical contacts and the wiring harness,
putting in place the seal device around the at least one of said at least two electrical contacts,
putting in place the at least two electrical contacts in the bore of the connector,
assuring a mechanical maintaining of the wiring harness on the connector by means of the part of the holder that is over-moulded, said part being formed by injection of plastic material.

* * * * *